United States Patent [19]

Wagner et al.

[11] Patent Number: 5,107,091

[45] Date of Patent: Apr. 21, 1992

[54] LASER DIODE ARRAY MOUNTING MODULE

[75] Inventors: David K. Wagner, South Pasadena; Allen D. Danner, Pasadena, both of Calif.

[73] Assignee: Applied Solar Energy Corporation, City of Industry, Calif.

[21] Appl. No.: 583,170

[22] Filed: Sep. 14, 1990

[51] Int. Cl.$^5$ .............................................. B27K 26/00
[52] U.S. Cl. ........................ 219/121.84; 219/121.76; 219/121.6; 372/36
[58] Field of Search ........... 219/121.84, 121.6, 121.85, 219/121.76; 372/34, 36

[56] References Cited

U.S. PATENT DOCUMENTS

| | | | |
|---|---|---|---|
| 3,872,496 | 3/1975 | Potter | 357/81 |
| 4,727,554 | 2/1988 | Watanabe | 372/36 |
| 4,758,926 | 7/1988 | Herrell et al. | 361/385 |
| 4,881,237 | 11/1989 | Donnelly | 372/34 |
| 4,894,709 | 1/1990 | Phillips et al. | 357/82 |

*Primary Examiner*—C. L. Albritton
*Attorney, Agent, or Firm*—Poms, Smith, Lande & Rose

[57] ABSTRACT

A mounting module for a laser diode array has a microchannel heat sink assembly and a circulation means for flowing a cooling fluid to and from the microchannel heat sink so as to dissipate heat. The microchannel heat sink has a plurality of internal microchannels, and has an external planar surface to affix laser diode submounts which facilitate attachment of laser emitting bars. The circulation mans comprises a housing having canals which circulate the cooling fluid. The housing has an external surface to which an electrical distribution means is placed, the distribution means providing electrical power to the laser diode array.

14 Claims, 3 Drawing Sheets

LASER DIODE ARRAY MOUNTING MODULE

INTRODUCTION

Generally stated, the present invention relates to the mounting of solid state circuitry and, more particularly, to a mounting module that provides power to a laser diode array and further provides for cooling of the laser diode array.

BACKGROUND OF THE INVENTION

Laser diodes are solid state electronic devices which convert electrical power to light. Such devices are commonly used in applications requiring high digital data rates, or electrical isolation of circuitry. The typical device has a laser emitting bar formed of a solid state material which is pumped or excited by pulsed electric current. The pumping of the device causes photon energy to be emitted from the device. Frequently, a high number of like devices are monolithically combined or stacked to form a laser diode array.

A problem commonly encountered with laser diode arrays is the dissipation of heat. A typical laser emitting bar operates at a range of 2 to 3 volts. An array covering a surface of 1 cm × 1 cm would typically contain 30 laser emitting bars and operate at a maximum of 90 volts. In ordinary usage, the array would be pumped with electric current of up to 100 amps. Assuming an average duty cycle of 1%, the total power to the array would be 100 watts. Since the typical array converts roughly 30% of the power to light energy, 70 watts of energy in the form of heat must be dissipated. Without adequate cooling, at this power level the array would quickly burn out.

In the prior art, numerous techniques have been suggested for cooling solid state integrated circuits. One such technique, disclosed in U.S. Pat. No. 4,758,926, provides a microchannel heat sink having a plurality of microscopic channels, or "microchannels." A cooling fluid is forced through the channels, which draws away the waste heat. The solid state device could be mounted directly onto the microchannel heat sink, or the microchannel heat sink could be formed as a lower layer of the solid state device.

A significant disadvantage and limitation of known microchannel heat sink cooling techniques is that they are not readily adaptable to laser diode arrays due to their significantly higher power and temperature dissipation requirement over that of other solid state devices. Therefore, it would be advantageous to provide a fully enclosed mounting module for a laser diode array which utilizes microchannel heat sink cooling techniques. It would also be desirable if such a mounting module could provide both power and a cooling fluid to the laser diode array. Additionally, it would be beneficial if the mounting module could be conveniently joined with other like modules to form a larger matrix.

SUMMARY OF THE INVENTION

It is therefore a primary object of the present invention to provide a mounting module for a laser diode array. It is also an object of the present invention to provide such a mounting module that can supply power and cooling fluid to the array. It is yet another object of the present invention to provide such a mounting module which could be combined with other like modules to form a laser diode array matrix.

Generally stated, the present invention is directed to a mounting module for a laser diode array. The module includes the provision of a manifold portion which conducts power and cooling fluid to the array, and a microchannel heat sink which provides structural support to the array and dissipates heat from the array. The module can operate singularly or can be combined with other like modules in a matrix.

More specifically, the mounting module of the present invention provides a manifold portion having a plurality of canals for the routing of a cooling fluid, and a microchannel heat sink having a multiplicity of internal microchannels through which flows the cooling fluid. Additionally, the microchannel heat sink provides a surface for attachment of laser emitting bars and attachment points to provide a path for the conduction of electrical power to the bars.

A more complete understanding of the laser diode array mounting module of the present invention will be afforded to those skilled in the art, as well as a realization of additional advantages and objects thereof, by a consideration of the following detailed description of a preferred exemplary embodiment. Reference will be made to the appended sheets of drawings which will first be described briefly.

DETAILED DESCRIPTION OF A PREFERRED EXEMPLARY EMBODIMENT

Figure 1:
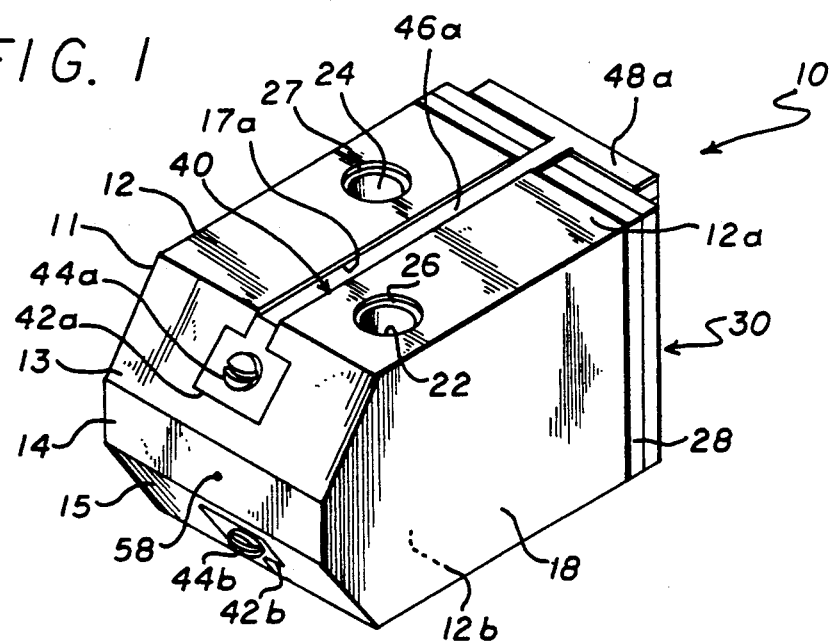
FIG. 1 is a perspective view of an exemplary laser diode array mounting module of the present invention.
Figure 4:
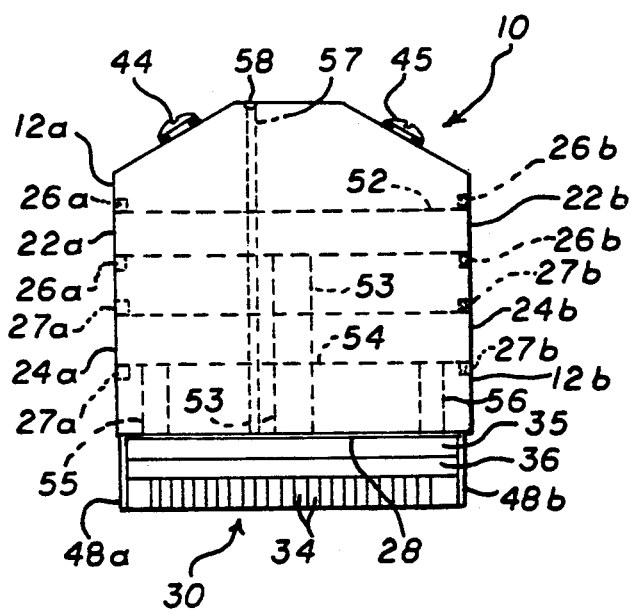
FIG. 4 is a side view of an exemplary laser diode array mounting module showing the exemplary circulation means.

Referring to FIGS. 1 and 4, a preferred exemplary embodiment of a laser diode array mounting module in accordance with the present invention is illustrated. The exemplary mounting module, shown generally at 10, has a box shaped manifold portion 11 joined to a microchannel heat sink 30, as will be described hereinbelow. It is intended that laser emitting bars 34 be affixed to the underside of the microchannel heat sink 30.

The exemplary manifold portion 11 is formed from a solid block of plastic, ceramic or other suitable material, and may be, in one exemplary embodiment, approximately 17 millimeters tall and 12 millimeters on the side. It has a front panel 12a, a rear panel 12b, and a side panel 18. The rear panel 12b is a mirror image of front panel 12a. The top of manifold 11 is generally triangular and formed from top panels 13, 14 and 15. A circular input port 22a and output port 24a are diagonally disposed on front panel 12a, with a similarly placed input port 22b and output port 24b on the rear panel 12b. Each of the input and output ports 22 and 24 are provided with O-ring seals 26 and 27. As commonly known in the industry, the O-ring seals are used for connecting the ports externally, such as to interconnect tubing. The input and output ports lead to a plurality of canals internal to the manifold portion 11, as will be described hereinbelow.

Figure 2:
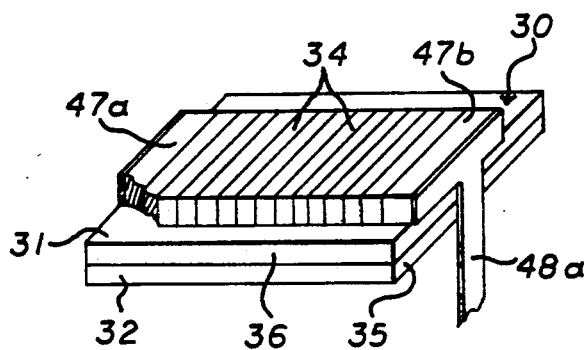
FIG. 2 is a partial view of the first surface of the exemplary microchannel heat sink showing the laser diode submounts.
Figure 3:
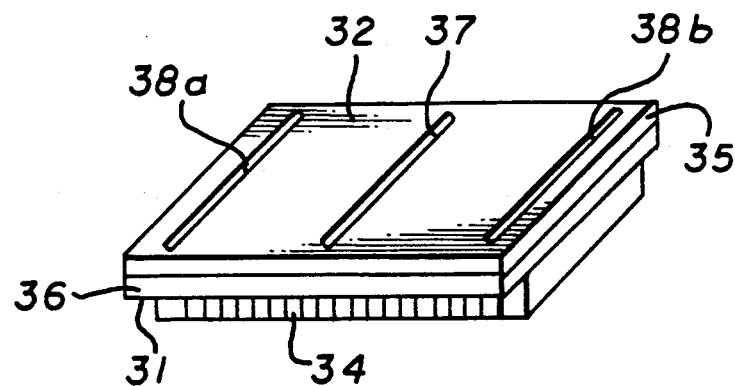
FIG. 3 is a partial view of the second surface of the exemplary microchannel heat sink showing the input and output vents.

The microchannel heat sink 30 is rectangular in shape and provides a broad surface area for the absorption of heat. In one exemplary embodiment, it is approximately 1 millimeter in thickness and is exemplarily made of a substrate material. As shown in FIGS. 2 and 3, the exemplary microchannel heat sink has a first surface 31 for attachment of the laser emitting bars, a second surface 32 which contacts the manifold portion 11, and a means for attachment of laser emitting bars 34 to the first surface 31, as will be described herein below.

The laser emitting bars 34 affix to the first surface 31 by the use of submounts. The exemplary submounts are constructed from a three layer sandwich of materials, consisting of a first layer of copper 90, a second layer of aluminum oxide 91 and a third layer of tungsten copper. The copper layer attaches to laser emitting bars 34 by use of known soldering techniques including a foil contact 93, and the tungsten copper layer 92 adheres to the first surface 31, also by soldering techniques. Accordingly, a thermal path is formed for conducting excess heat generated by the laser emitting bars 34 first to the submounts, then into the microchannel heat sink 30. The submounts also conduct electrical power into the laser emitting bars 34.

The first surface 31 is dimensioned to accomodate exemplarily thirty laser emitting bars 34 to be attached thereto per the technique described above. The laser emitting bars 34 would be mounted in adjacent rows, or stacked. Adjacent sides of the submounts are connected electrically, so that the plurality of submounts are in series. At each end of the stack of serially connected submounts 33 are metal spacers 47a and 47b. The spacers 47a and 47b electrically connect to submounts 33, as will be described hereinbelow. It is anticipated that up to 90% of the surface area of the first surface 31 be covered by laser emitting bars 34.

In an alternative embodiment of the present invention, a stack of laser emitting bars 34 is attached to first surface 31 by use of a thin epoxy joint. In yet another embodiment of the present invention the stack of laser emitting bars 34 is coated with a thin insulator and metal film. This coating forms the submount 33 directly onto the laser emitting bars 34, which is then soldered to first surface 31.

Figure 5:
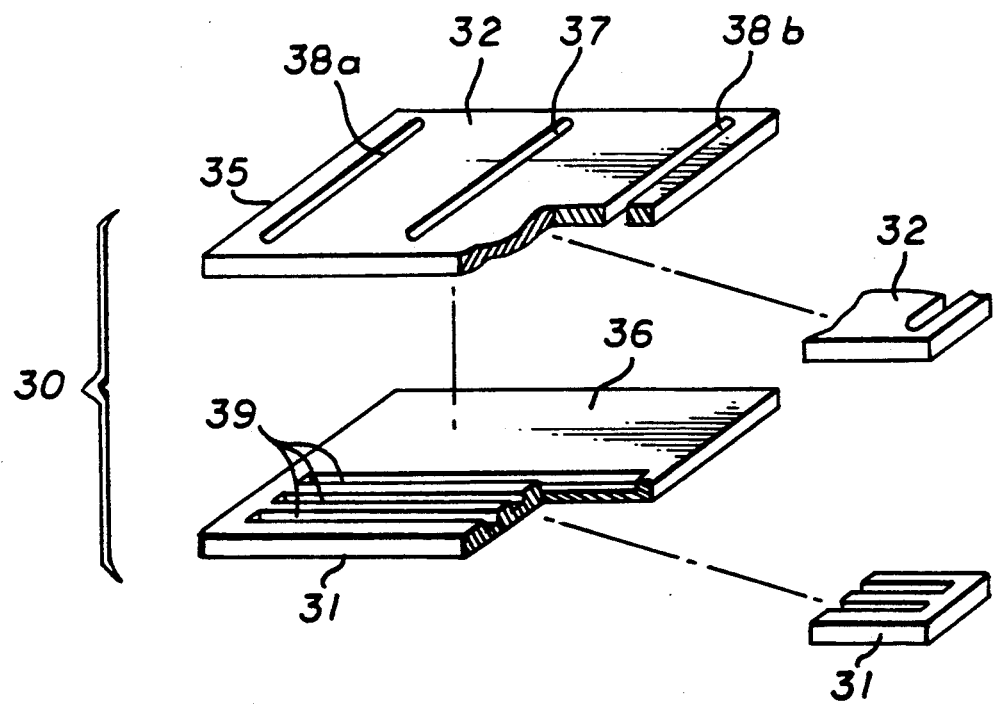
FIG. 5 is an exploded view of the exemplary microchannel sink, showing the microchannels.
Figure 6:
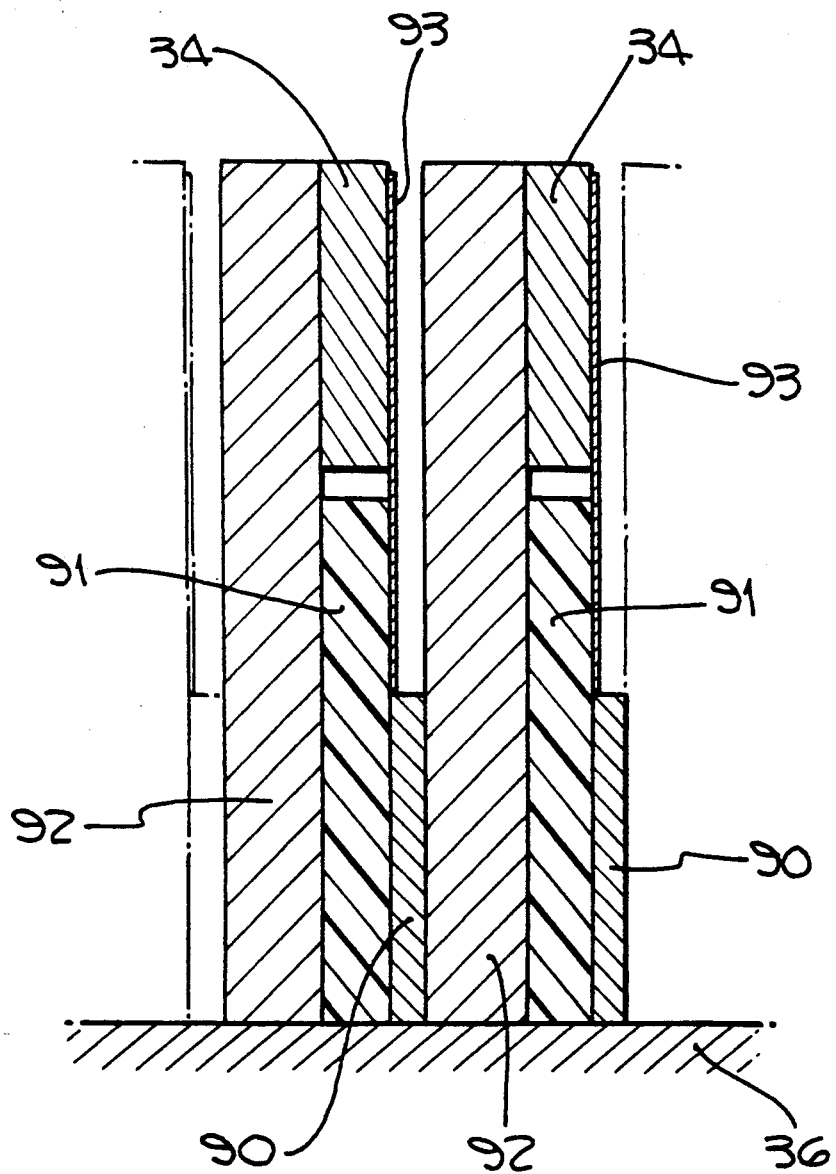
FIG. 6 is a side view of the exemplary submounts.

Referring now to FIG. 5, the exemplary microchannel heat sink 30 comprises a manifold plate 35 and a channel plate 36. The manifold plate 35 provides the second surface 32, and associated intake vent 37 and exhaust vents 38a and 38b. The channel plate 36 has a multiplicity of alternating microchannels 39 in its interior portion, and provides the hereinabove described first surface 31. The channel plate 36 and manifold plate 35 are attached together using known bonding techniques to form the microchannel heat sink 30. Microchannel heat sinks of the type described can be commonly found in the industry.

As shown in FIG. 3 the intake vent 37 bisects the width of the second surface 32, and the exhaust vents 38a and 38b run parallel to the intake vents and are adjacent to opposite edges of the second surface 32. The plurality of vents lead to the multiplicity of microchannels 39 within the microchannel heat sink 30, as exposed in FIG. 5. In an exemplary embodiment, the microchannels would be approximately 50 micrometers in width, and cross the breadth of the microchannel heat sink, following an alternating path which leads from the intake vent 37 to each of the exhaust vents 38a and 38b. The microchannels 39 guide the flow of a cooling fluid through the microchannel heat sink 30, whereupon heat is drawn away from the first surface 31 by the flowing fluid.

In the present invention, a circulation means is provided to route the cooling fluid to the microchannel heat sink 30. The circulation means flows the cooling fluid from an external source to the microchannel heat sink intake vent 37, and then flows the cooling fluid from the microchannel heat sink exhaust vents 38a and 38b to an external drain. The exemplary circulation means comprises the intake ports 22a and 22b, the exhaust ports 24a and 24b, and the plurality of canals internal to the manifold portion 11.

As shown in FIG. 4, a horizontal intake canal 52 links the intake ports 22a and 22b. A vertical intake canal 53 joins the center of horizontal intake canal 52, and leads to the bottom of the manifold portion 11 to a location adjoining intake vent 36. Similarly, a horizontal exhaust canal 54 links the exhaust ports 24a and 24b, and a pair of vertical exhaust canals 55 and 56 join the horizontal exhaust canal 54, leading to the bottom of the manifold portion 11 to locations adjoining exhaust vents 38a and 38b, respectively. The network of canals allows for the cooling fluid to enter an intake port 22 and flow through the intake canals 52 and 53 to the intake vent 37. The canals can be easily formed in the solid plastic manifold portion 11 by known machining techniques. After passing through the microchannel heat sink 30, the cooling fluid flows from the exhaust vents 38a and 38b through the exhaust canals 54, 55 and 56 to an exhaust port 24.

To prevent leakage of cooling fluid from between the boundary adjoining the manifold portion 11 and the microchannel heat sink 30, gasket 28 is provided, which is inserted between the two components. The exemplary gasket 28 has openings corresponding to the intake vent 37 and exhaust vents 38a and 38b.

As described hereinabove, laser emitting bars draw a substantial amount of power. Therefore, in the present invention, a means for distributing electrical power to the bars 34, is provided. The exemplary electrical distribution means, shown generally at 40, is formed of a metal foil, and has a first connection pair 42a and 42b, an elongated portion 46a and 46b, and a second connection pair 48a and 48b. The first connection pair 42a and 42b are disposed on top panels 13 and 15 respectively, and provide points for the input of electrical power. Exemplary screws 44a and 44b are associated with the first connection pair 42a and 42b, and provide for the attachment of an external power source, such as by wires. The elongated portions 46a and 46b traverses the length of the manifold portion 11 within an associated groove 17a and 17b. The second connection pair 48a and 48b electrically connects to metal spacers 47a and 47b, which electrically connect to the outermost ones of the serially connected submounts 33. Electrical power is therefore enabled to travel from an external source to the submounts 33 and into the laser emitting bars 34. Additionally, the metal foil of the electrical distribution means 40 provides structural integrity to the exemplary mounting module, in that it holds the manifold portion 11 and the microchannel heat sink 30 together.

It is anticipated that the laser diode array mounting module of the present invention be used either alone or linked into a network of like modules. Operating singularly, one of the input ports 22 and one of the output ports 24 would be blocked. By connecting a cooling fluid source to the remaining input port 22, and a drain to the remaining output port 24, fluid pressure would force a flow of cooling fluid through the manifold portion 11 and microchannel heat sink 30, thereby cooling the device. In a network mode, the second set of input and output ports, 22 and 24 respectively, would be connected to an adjacent, similar module. This way, a single cooling source could be utilized to cool the entire network.

It is further anticipated that the mounting module of the present invention be equipped with varying numbers of laser emitting bars, depending on the desired usage of the operator. The operator can utilize different cooling fluid mixtures depending on the density of the laser emitting bars and the desired operating temperature. For usages requiring an operating temperature of 40° C., it is anticipated that water be used as the cooling fluid. For usages requiring lower temperatures, such as below 0° C., it is anticipated that a mixture of water and methanol be utilized.

An alternative embodiment of the exemplary laser diode mounting module further comprises a means for sensing the temperature of the microchannel heat sink. The sensing means would enable the prevention of over heating of the laser emitting bars, and any associated heat related damage to the module. A thermocouple channel 57 would be provided in manifold 11, as best shown in FIG. 4. Channel 57 is a port through which a thermocouple wire may be inserted. The temperature of the microchannel heat sink 30 can be measured at the thermocouple port 58 by known measuring techniques. For example, the thermocouple would be inserted into channel 57 until it makes contact with the surface 32. The thermocouple may then be glued or epoxied in place. It is anticipated that this temperature information be utilized in conjunction with known logic techniques to disable the laser diode array upon reaching a maximum temperature. For example, the thermocouple would indicate an over temperature condition of the microchannel cooler 30 should the channel 30 become clogged or coolant flow interrupted.

There has been described hereinabove a preferred exemplary embodiment of a novel mounting module for a laser diode array. It is apparent that those skilled in the art may now make numerous uses of and departures from the above described embodiment without departing from the inventive concepts disclosed herein. Accordingly, the present invention is to be defined solely by the scope of the following claims.

We claim:

1. A mounting module for a laser diode array, comprising:
    a plurality of laser emitting bars;
    a planar microchannel heat sink assembly having a first and second surface, a plurality of elongated submounts electrically connected in series, said submounts attached to and connecting said laser emitting bars in series and being connected to said first surface, said microchannel heat sink assembly further including an intake vent and a plurality of exhaust vents in said second surface and a multiplicity of microchannels running through the interior of said heat sink assembly;
    a manifold having a plurality of intake ports, a plurality of exhaust ports and a plurality of internal canals, said intake and exhaust ports disposed on an external surface of said module, said canals conducting said cooling fluid from said intake port to said intake vent and from said exhaust vents to said exhaust port; and
    a power distribution circuit including a pair of electrical connection points and a pair of electrical leads, each of said leads radiating from a respective end of said elongated submounts electrically connected in series to a respective one of said electrical connection points, said electrical power distribution circuit enabling electrical power to flow to said laser emitting bars via said submounts.

2. The module of claim 1, wherein:
    said intake vent is elongated and bisects the width of said second surface, and said exhaust vents are disposed parallel to said intake vent and adjacent to opposite sides of said second surface.

3. The module of claim 1, wherein said cooling fluid is water.

4. The module of claim 1, wherein said cooling fluid is a mixture of water and methanol.

5. The module of claim 1, wherein said electrical leads are of a metal foil.

6. The module of claim 1, wherein said microchannels have a width of 50 micrometers.

7. The module of claim 1, further comprising:
    a means for sensing the temperature of said microchannel heat sink, said means comprising a thermocouple channel to measure heat from said microchannel heat sink.

8. A laser diode array mounting module, comprising:
    a housing having a manifold portion, an external portion and an emitting surface, said manifold portion having a plurality of canals, said external portion having a plurality of intake ports and a plurality of exhaust ports;
    a plurality of laser emitting bars electrically connected to a plurality of submounts, said submounts being electrically connected in series and affixed to said emitting surface, said plurality of submounts having a pair of first electrical connection points, each of said first connection points being disposed at a respective end of said serially connected submounts;
    means for distributing electrical power to said plurality of laser diode submounts, said means having a pair of second electrical connection points on said external portion of said housing, and a pair of electrical leads radiating along the surface of said housing, said leads joining a respective one of said first connection points with a respective one of said second connection points;
    a planar microchannel heat sink assembly having a first and second surface, an intake vent, a plurality of exhaust vents, and a multiplicity of channels which join said intake and exhaust vents and which are formed interiorly of said heat sink assembly, said first surface providing said emitting surface and said second surface being internal to said housing, said intake and exhaust vents being disposed on said second surface, said plurality of submounts being attached to said first surface by the use of soldering;
    said intake port attaches to one of said canals which further attaches to said intake vent, and said exhaust vents attach to others of said canals which join and further attach to said exhaust port, whereby, a path is formed for the circulation of a cooling fluid throughout said module.

9. The module of claim 8, wherein said housing is constructed of plastic.

10. The module of claim 8, wherein said electrical leads are constructed of a metal foil.

11. The module of claim 8, wherein said cooling fluid is water.

12. The module of claim 8, wherein said cooling fluid is a mixture of water and methanol.

13. The module of claim 8, further comprising:

a means for sensing the temperature of said microchannel heat sink, said sensing means comprising a thermocouple for measuring heat from said microchannel heat sink.

14. The module of claim 8, wherein said microchannels have a width of 50 micrometers.

15. The module of claim 8, wherein said housing is constructed of ceramic.

* * * * *